(12) United States Patent  
Male

(10) Patent No.: US 6,879,008 B2
(45) Date of Patent: Apr. 12, 2005

(54) INTEGRATED THERMAL DIFFERENCE SENSOR FOR POWER DISSIPATING DEVICE

(75) Inventor: Barry J. Male, West Granby, CT (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/781,123

(22) Filed: Feb. 17, 2004

(65) Prior Publication Data

US 2004/0159887 A1 Aug. 19, 2004

Related U.S. Application Data

(62) Division of application No. 10/014,988, filed on Dec. 11, 2001, now Pat. No. 6,717,225.

(51) Int. Cl.$^7$ ............................................... H01L 29/76
(52) U.S. Cl. ...................... 257/401; 136/201; 136/205; 136/208; 257/E23.08
(58) Field of Search .............................. 136/201, 205, 136/208; 257/E23.08

(56) References Cited

U.S. PATENT DOCUMENTS 4,463,214 A * 7/1984 Lowther ...................... 136/208

* cited by examiner

Primary Examiner—Michael Tran
Assistant Examiner—Mai-Huong Tran
(74) Attorney, Agent, or Firm—W. Daniel Swayze, Jr.; W. James Brady; Frederick J. Telecky, Jr.

(57) ABSTRACT

A Seebeck effect thermal sensor is formed in an integrated fashion with a power-dissipating device such as a power MOSFET. The integrated device generates a temperature difference between a relatively cold peripheral area and a relatively warm central area, the temperature difference having a known relationship to electrical operating conditions of the device. A structure for a power MOSFET includes two side-by-side arrays of source/drain diffusions. The Seebeck sensor has warm junctions at the central area and cold junctions at the peripheral area, and generates an electrical output signal having a known relationship to the temperature difference between the peripheral and central areas to provide an indication of the electrical operating conditions of the device. One Seebeck sensor includes alternating metal and polysilicon traces, wherein the polysilicon traces lie between source and drain diffusions of a power MOSFET just as do active polysilicon gates. Multiple pairs of conductors can be placed in series to obtain a higher-gain Seebeck sensor.

5 Claims, 4 Drawing Sheets

INTEGRATED THERMAL DIFFERENCE SENSOR FOR POWER DISSIPATING DEVICE

CROSS REFERENCE TO RELATED APPLICATIONS

This application claims priority under 35 USC § 120 of application Ser. No. 10/014,988, filed Dec. 11, 2001 now U.S. Pat. No. 6,717,225. This application is a divisional of the above mentioned application.

STATEMENT REGARDING FEDERALLY SPONSORED RESEARCH OR DEVELOPMENT

Not Applicable

BACKGROUND OF THE INVENTION

The present invention is related to the field of power semiconductor devices, and more particularly to circuits and structures for sensing thermal operating characteristics of power devices for device protection or other purposes.

Thermal protection of integrated power devices, such as integrated MOSFET power switches, is typically employed where a specific set of operating conditions and part mounting choices may cause the device to exceed its maximum operating temperature. One typical protection method involves measuring the temperature at the center of the power device and comparing it against a reference. When the measurement shows that the equivalent temperature has exceeded a predetermined value, such as 150° C., the device is shut down. A typical choice for measurement involves the use of a forward biased diode with a temperature coefficient of approx. −2 mV/° C. placed at the hottest part of the power device, typically its center. The diode voltage is compared with a predetermined threshold voltage corresponding to the absolute temperature of interest, such as 150° C. The output of the comparator is used to trigger shutdown or other protection operations as desired.

In protection schemes employing a separate sensing device such as a diode, typically the sensing device must have both electrical isolation and barrier guard rings for noise isolation from the power MOSFET. Interconnect must be routed to the center of the power MOSFET to bias the device and to carry the measurement voltage to the comparison circuitry. Such requirements typically result in a significant breakup of the center of the power MOSFET, thus increasing its silicon area.

There are also problems that arise due to the reliance upon measuring absolute temperature. First, the measurement is subject to variability arising from semiconductor process variations. Additionally, the technique is non-predictive, i.e., a power dissipating fault must continue until the die temperature is pumped up to an absolute value that trips the detection circuit. Testing of the protection circuitry may be very difficult or impossible, because testing risks destruction of the device. It would be desirable to overcome these shortcomings of prior device protection techniques.

BRIEF SUMMARY OF THE INVENTION

In accordance with the present invention, a thermal sensor is disclosed that is formed in an integrated fashion with a power-dissipating device. The thermal sensor does not rely on absolute temperature measurement, and therefore can be tested more effectively and can be used in a predictive manner.

The disclosed sensor exploits the Seebeck effect, in which a current can be made to flow in a circuit having two dissimilar-metal junctions maintained at different temperatures. This effect is obtained through a novel arrangement on a semiconductor integrated circuit using dissimilar conductors. A disclosed sensor employs aluminum and polysilicon conductor pairs, but this effect can be achieved with other pairs such as aluminum and copper.

The disclosed thermally monitored power-dissipating device includes a power dissipating device structure that generates a temperature difference between a relatively cold peripheral area of the device and a relatively warm central area of the device, wherein the temperature difference has a known relationship to electrical operating conditions of the device. In one embodiment, the structure includes two side-by-side arrays of source/drain diffusions of a power MOSFET, wherein the central area is an area between the two arrays and the peripheral area lies at the outer edge of the device.

A Seebeck effect thermoelectric sensor is integrally formed with the device structure. The sensor has one or more warm junctions at the central area of the device and one or more cold junctions at the peripheral area of the device, and generates an electrical output signal having a known relationship to the temperature difference between the peripheral and central areas of the device so as to provide an indication of the electrical operating conditions of the device. In one embodiment, the Seebeck effect sensor comprises alternating metal and polysilicon traces, wherein the polysilicon traces lie between source and drain diffusions of a power MOSFET just as do active polysilicon gates. Such a sensor is easily formed in an integrated fashion with the power MOSFET without requiring separate bias conductors or guard structures. Multiple pairs of conductors can be placed in series to obtain a higher-gain Seebeck sensor, resulting in greater sensitivity and/or noise immunity.

Other aspects, features, and advantages of the present invention will be apparent from the detailed description that follows.

BRIEF DESCRIPTION OF THE SEVERAL VIEWS OF THE DRAWING

The invention will be more fully understood by reference to the following Detailed Description of the invention in conjunction with the Drawing, of which.

DETAILED DESCRIPTION OF THE INVENTION

Figure 1:
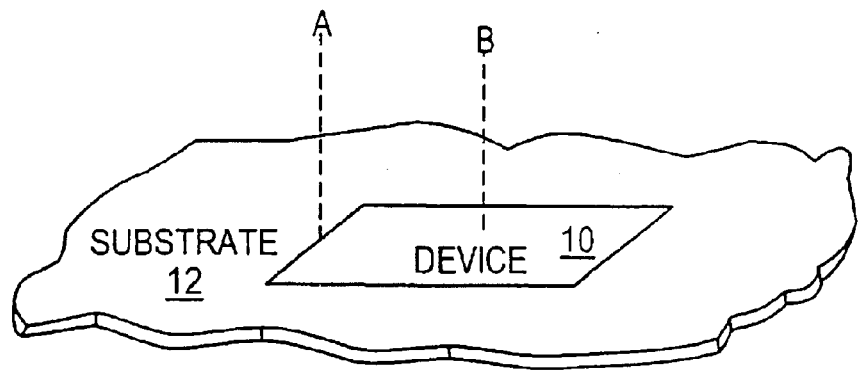
FIG. 1 is a diagram depicting a power dissipating device on a semiconductor substrate in accordance with the present invention.

In FIG. 1, a power-dissipating device 10 is formed on a substrate 12 of semiconductor material, such as silicon. In general, the device 10 may be any of several different types of circuit elements, such as a power transistor, resistor, diode, or other power-dissipating semiconductor device. The device 10 has an edge or peripheral area, labeled 'A' in FIG. 1, and a central area, labeled 'B'. The central area B is generally the hottest area, or one of the hottest areas, of the device 10 during its operation.

Figure 2:
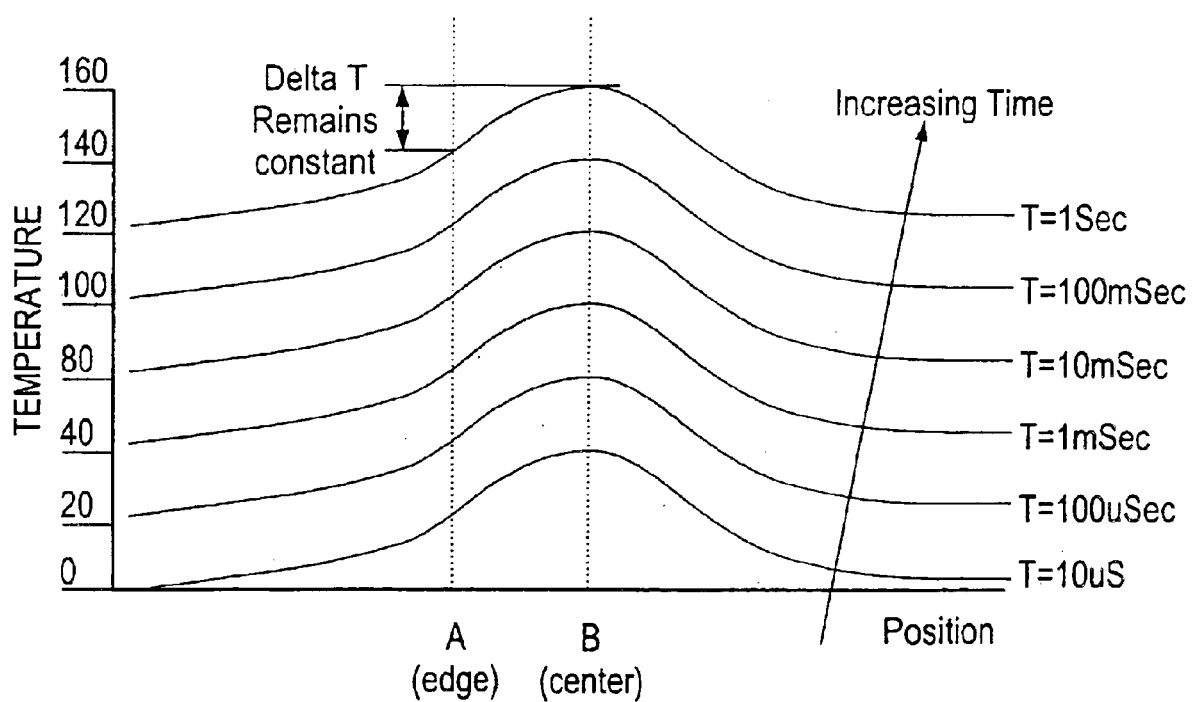
FIG. 2 is a plot of temperature-versus-position characteristics at different times in the vicinity of the device of FIG. 1.

FIG. 2 shows several curves of temperature versus position at different times during operation of the device 10 of FIG. 1. At any given time, the temperature versus position characteristic follows a corresponding one of the curves, which has a relative temperature maximum at location B and trails away to smaller values with increasing distance from B. The time dimension is shown exponentially over the period of 10 microseconds to 1 second of initial device operation, i.e., from a condition of low device operating temperature to a condition of normal device operating temperature.

FIG. 2 shows that the difference in temperature between points A and B of the device stays fairly constant despite the relatively wide variation in the absolute device temperature under different operating conditions. In FIG. 2, this temperature difference between points A and B is approximately 20° C., over an absolute temperature range of approximately 40° C. to 160° C. In general, the exact shape and spacing of temperature-vs.-position curves such as those of FIG. 2 vary for different devices, depending on power dissipation, materials, and geometry, including of course the spacing between points A and B. In a MOSFET having a given "on" resistance, the temperature difference between central and peripheral areas of the device is a function of current through the device. A broad array of power-dissipating devices tend to exhibit the same qualitative behavior as illustrated in FIG. 2. Such temperature profiles can serve as the basis for sensing an operating parameter of a device, such as power dissipation or current, from the temperature difference between two different areas of the device.

Figure 3:
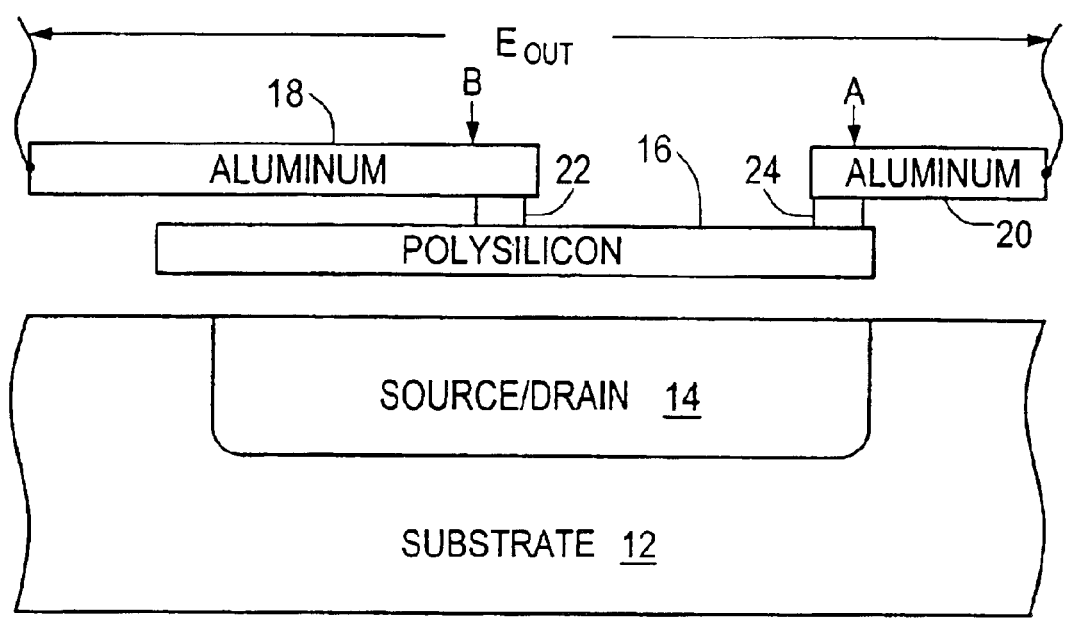
FIG. 3 is a side view of a MOSFET device and an associated aluminum-polysilicon-aluminum thermoelectric sensor in accordance with the present invention.

FIG. 3 shows an arrangement for sensing differential temperature of a metal-oxide-semiconductor field-effect transistor (MOSFET) device. FIG. 3 is an end view of the MOSFET, showing a source or drain diffusion 14 in the substrate 12. It will be appreciated that device current is conducted in a direction orthogonal to the view of FIG. 3. Power dissipation tends to be highest at a central area B, and substantially lower at an edge area A.

A sensor exploiting the Seebeck effect converts the temperature difference between areas A and B into a corresponding electro-motive force (EMF). The sensor includes dissimilar conductors that form respective junctions at the relatively cold and hot locations A and B. A first conductor 16 of polysilicon is disposed above the diffusion-bearing substrate 12. Second conductors 18 and 20 of aluminum are formed above the polysilicon conductor 16, along with respective aluminum-to-poly junctions 22 and 24. The junction 22 serves as the "hot" junction by virtue of its location at central area B of the device, whereas the junction 24 serves as the "cold" junction by virtue of its location at peripheral area A. The Seebeck sensor of FIG. 3 generates an EMF, indicated as "$E_{OUT}$", of approximately 0.7 millivolts per degree C of temperature difference between the hot and cold junctions 22 and 24. This value is referred to as the "thermal EMF" of the sensor.

Figure 4:
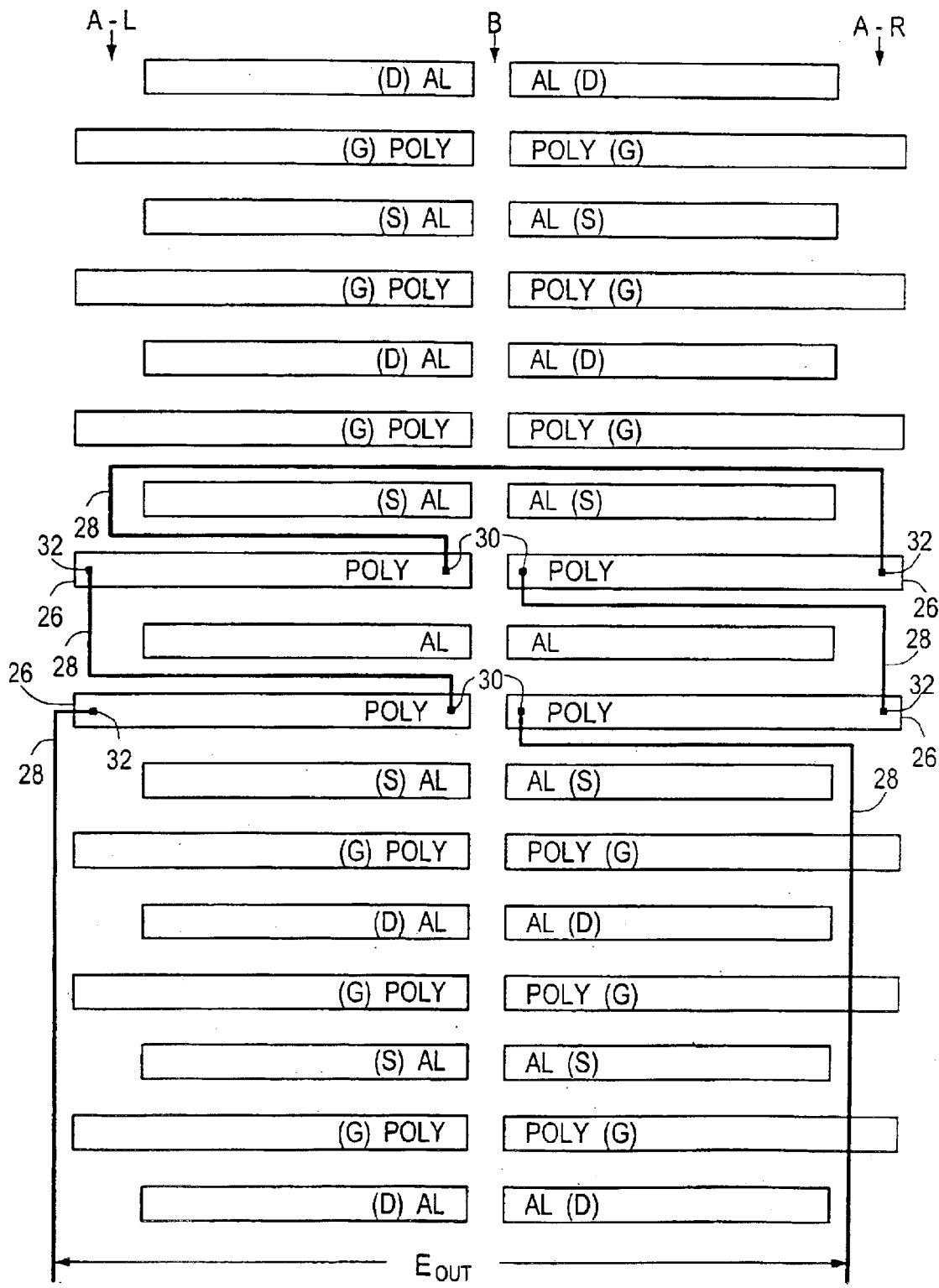
FIG. 4 is a plan view of a MOSFET device having centrally located aluminum and polysilicon strips forming a thermoelectric sensor in accordance with the present invention.

FIG. 4 shows a plan view of a power MOSFET having an integrated Seebeck differential temperature sensor. The MOSFET includes two arrays of parallel-connected devices, one array between a central area B and a left peripheral area A-L, and another array between the central area B and a right peripheral area A-R. Each array includes alternative traces of aluminum (AL) for source/drain (S/D) connections and polysilicon (POLY) for gate (G) connections. Source/drain diffusions (not shown) are formed underneath the AL traces, and the POLY traces are generally formed above gate regions (not shown) residing between adjacent source and drain diffusions.

As shown, a Seebeck effect sensor is formed from several POLY traces 26 and additional aluminum traces 28 arranged at the center of the MOSFET. Four hot junctions 30 and four cold junctions 32 are formed, and these are wired in series by the traces 28. This series arrangement yields a compound Seebeck sensor having a thermal EMF of approximately 2.8 mV/° C. Moreover, the (A-L)-(B)-(A-R) arrangement tends to compensate for background thermal gradients that might otherwise impair the fidelity of the sensor. Any left-to-right background temperature gradient HAS opposite effects on the sensor segments on opposite sides of the central area B, and therefore tends to be cancelled out of the final output voltage $E_{OUT}$. Such undesirable temperature gradients might arise, for example, if the MOSFET were placed in proximity to other on-chip heat sources or sinks. It is generally desirable to minimize such gradients where possible, and to incorporate either geometric features or other means for canceling the effects of such gradients if necessary. The (A-L)-(B)-(A-R) layout is an example of such an error-canceling geometric arrangement.

Figure 5:
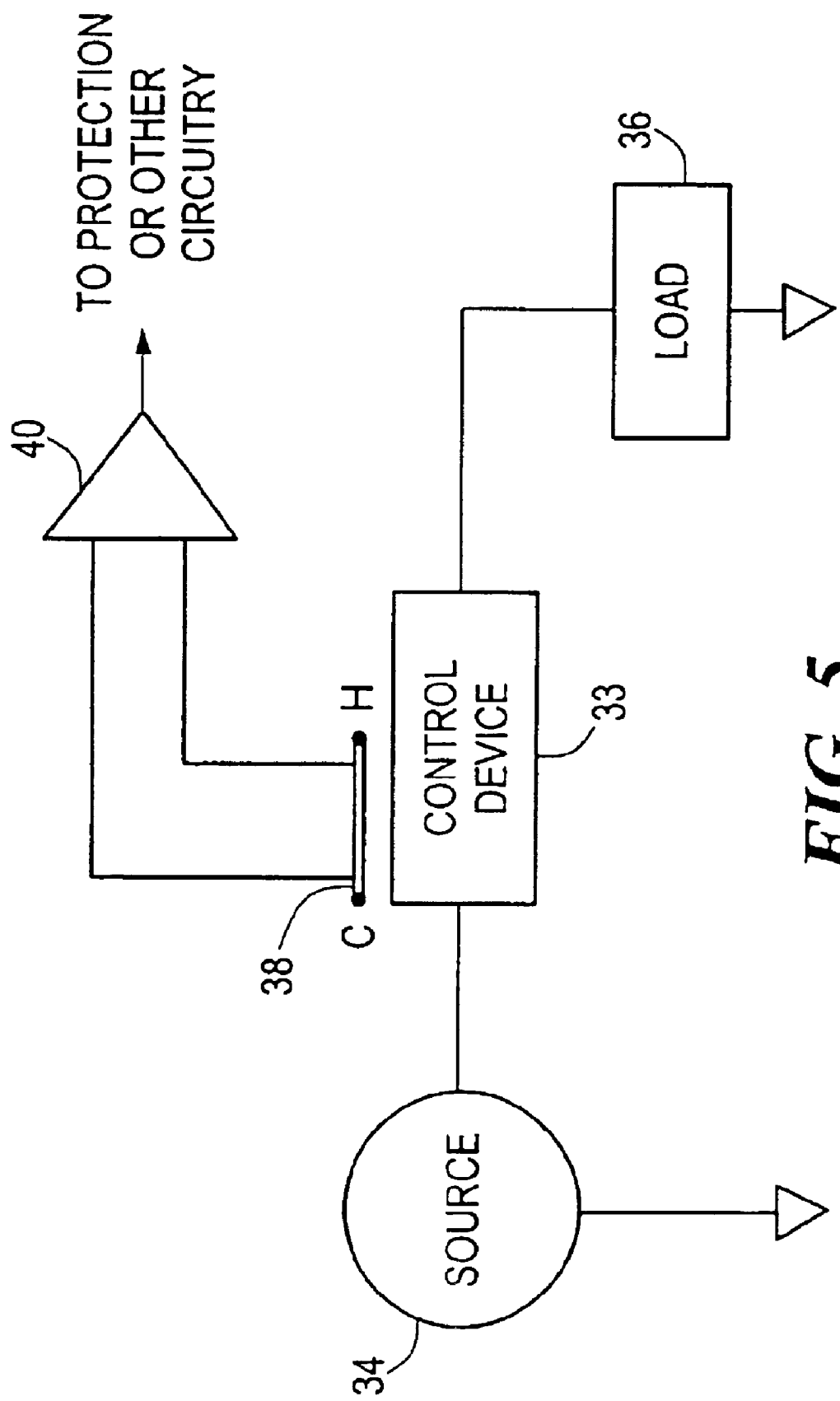
FIG. 5 is a schematic diagram of a circuit having a power dissipating device and associated thermoelectric sensor in accordance with the present invention.

FIG. 5 shows a general class of applications for devices incorporating integrated differential temperature sensors as disclosed herein. A control device 33, such as a power MOSFET, is arranged between source circuitry 34 and a load 36. For example, the source circuitry 34 may include the relatively low-power components of a power regulator, which controls delivery of electrical power to the load 36 via a relatively high-power control device 33. Integrated with the device 33 is a Seebeck effect sensor 38 for sensing a differential operating temperature of the device 33. The output of the sensor 38 is supplied to a differential amplifier 40 for buffering and gain, and the output of the amplifier 40 is supplied to other circuitry (not shown) to be used for an intended purpose. One broad class of such circuitry is protection circuitry, such as thermal shutdown circuitry that disables the control device 33 when the sensed thermal difference exceeds a predetermined threshold indicative of an over-current or over-power condition.

More generally, the output of the sensor 38 may be used in one of several ways. In a first method, the local power dissipation of a device is directly measured by providing an output analog signal indicative of instantaneous power. Alternatively, the differential temperature measurement can be compared with a fixed threshold to obtain an indication that power being dissipated locally may create an over-temperature condition at some future time. This can be used for a predictive thermal shutdown that protects the power device when its power rating has been exceeded. If desired, a conventional diode type thermal sensor could also be used to measure common-mode die temperature outside of the power device, and the two comparator signals could be OR'd together. In yet another method, the reference trip point for the differential temperature measurement can be made inversely proportional to absolute, common-mode die temperature by using a simple diode. In this method, the temperature difference allowed would decrease at high common-mode die temperatures, effectively limiting the peak die temperature in the center of the power device. The structures described could also be used to characterize temperature gradients over the surface of devices on the silicon.

It will be apparent to those skilled in the art that modifications to and variations of the disclosed methods and apparatus are possible without departing from the inventive concepts disclosed herein, and therefore the invention should not be viewed as limited except to the full scope and spirit of the appended claims.

What is claimed is:

1. A thermally monitored power dissipating semiconductor device, comprising:

a power dissipating device structure operative to generate a temperature difference between a relatively cold peripheral area of the device and a relatively warm central area of the device, the temperature difference having a known relationship to electrical operating conditions of the device; and a Seebeck effect thermoelectric sensor integrally formed with the device structure, the sensor having one or more warm junctions at the central area of the device and one or more cold junctions at the peripheral area of the device, the sensor being operative to generate an electrical output signal having a known relationship to the temperature difference between the peripheral and central areas of the device so as to provide an indication of the electrical operating conditions of the device.

2. A semiconductor device according to claim 1, wherein the power dissipating device structure comprises a power MOSFET.

3. A semiconductor device according to claim 1, wherein the power dissipating device structure comprises source and drain diffusions of a power MOSFET, and wherein the hot and cold junctions of the sensor are formed by respective traces of polysilicon and metal disposed over the source and drain diffusions.

4. A semiconductor device according to claim 1 having multiple warm junctions and a corresponding number of cold junctions to form a number of warm-cold junction pairs, the junction pairs being connected in series such that the thermal-to-electrical gain of the Seebeck sensor is substantially proportional to the number of such pairs.

5. A semiconductor device according to claim 1, wherein the sensor has a geometric arrangement effective to cancel the effect of background thermal gradients on the substrate.

* * * * *